US008957804B2

(12) United States Patent
Nakanishi

(10) Patent No.: US 8,957,804 B2
(45) Date of Patent: Feb. 17, 2015

(54) SUCCESSIVE APPROXIMATION A/D CONVERTER

(71) Applicant: Asahi Kasei Microdevices Corporation, Tokyo (JP)

(72) Inventor: Junya Nakanishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/059,680

(22) Filed: Oct. 22, 2013

(65) Prior Publication Data

US 2014/0118175 A1    May 1, 2014

(30) Foreign Application Priority Data

Oct. 30, 2012  (JP) .................. 2012-238984
Jul. 9, 2013   (JP) .................. 2013-143474

(51) Int. Cl.
*H03M 1/12* (2006.01)
*H03M 1/06* (2006.01)
*H03M 1/46* (2006.01)

(52) U.S. Cl.
CPC ............ *H03M 1/0678* (2013.01); *H03M 1/468* (2013.01)
USPC ............ 341/172; 341/118; 341/120; 341/155

(58) Field of Classification Search
CPC ....... H03M 1/468; H03M 1/804; H03M 1/46; H03M 1/12; H03M 1/125; H03M 1/002; H03M 1/38; H03M 1/403; H03M 1/00; H03M 1/0697
USPC .................. 341/118, 122, 155, 172
See application file for complete search history.

(56) References Cited

U.S. PATENT DOCUMENTS 4,196,421 A * 4/1980 Decoursey et al. ........... 370/466
4,620,179 A * 10/1986 Cooper et al. ................ 341/156

(Continued)

FOREIGN PATENT DOCUMENTS

JP    H02-244823 A    9/1990
JP    2010-288111 A   12/2010

(Continued)

OTHER PUBLICATIONS

Yoneyama, "Analog-to-Digital Converter", Ohmsha Ltd., Sep. 25, 1983, pp. 99-104 (partial translation).

*Primary Examiner* — Linh Nguyen
(74) *Attorney, Agent, or Firm* — Morgan, Lewis & Bockius LLP

(57) ABSTRACT

The successive approximation A/D converter includes: switch groups 105_1 to 105_x each of which is connected to the other end of each corresponding capacitor of capacitors 106_1 to 106_x to selectively switch a capacitor to be applied to a successive comparison in response to a switch group control signal Ct1; a comparator 104 for making a successive comparison of a comparison voltage VSN based on a holding voltage on each corresponding capacitor, selected through the switch groups from among the capacitors, with a predetermined reference voltage VC in synchronization with a timing control signal CLK to obtain a judgment output according to the comparison result; and a voltage application part 107 for applying a predetermined voltage to the comparison voltage based on a form-of-voltage application control signal Ct2 for a predetermined period when a predetermined time has elapsed after the successive comparison.

11 Claims, 9 Drawing Sheets

(56) References Cited

U.S. PATENT DOCUMENTS

| | | | |
|---|---|---|---|
| 5,027,116 A * | 6/1991 | Armstrong et al. | 341/120 |
| 6,154,164 A * | 11/2000 | Gross, Jr. | 341/163 |
| 6,351,231 B1 * | 2/2002 | Price et al. | 341/155 |
| 6,400,302 B1 * | 6/2002 | Amazeen et al. | 341/172 |
| 6,747,589 B2 * | 6/2004 | Srinivasan et al. | 341/172 |
| 6,828,927 B1 * | 12/2004 | Hurrell et al. | 341/156 |
| 7,400,118 B1 * | 7/2008 | Zhang et al. | 323/222 |
| 7,834,793 B2 * | 11/2010 | Carreau et al. | 341/155 |
| 8,134,487 B2 * | 3/2012 | Harpe | 341/163 |
| 8,193,957 B2 | 6/2012 | Yoshioka | |
| 8,456,340 B2 * | 6/2013 | Kapusta et al. | 341/144 |
| 8,659,464 B2 * | 2/2014 | Jeon et al. | 341/163 |
| 2010/0127908 A1 * | 5/2010 | Carreau et al. | 341/155 |
| 2013/0162454 A1 * | 6/2013 | Lin | 341/120 |

FOREIGN PATENT DOCUMENTS

| | | |
|---|---|---|
| JP | 2011-061597 A | 3/2011 |
| JP | 2011-114577 A | 6/2011 |
| JP | 2011-124929 A | 6/2011 |
| JP | 2011-199403 A | 10/2011 |

* cited by examiner

US 8,957,804 B2

SUCCESSIVE APPROXIMATION A/D CONVERTER

TECHNICAL FIELD

The present invention relates to a successive approximation A/D converter applied to an input circuit of digital equipment or the like, and more specifically to a robust successive approximation A/D converter that does not fall into metastable states.

BACKGROUND ART

As a conventional successive approximation A/D converter, for example, there is a successive approximation A/D converter disclosed in Non-Patent Document 1. This successive approximation A/D converter A/D converts an analog input signal Ain into an n-bit digital output signal Vout (where n is a natural number of 3 or more).

FIG. 7 is a circuit configuration diagram for describing a conventional successive approximation A/D converter shown in Patent Document 3 (see FIG. 5).

As shown in FIG. 7, one capacitor 506_1 whose capacitance value is set to a predetermined reference capacitance C is provided in this successive approximation A/D converter. Further, (n−2) capacitors 506_2 to 506_(n−1), each of which is set to have each of capacitances C/2 to C/2 (n−2) obtained by weighting the above reference capacitance C with the reciprocals of powers of 2 in a step-by-step manner, are also provided. Further, one capacitor 506_n whose capacitance is set to be $C/2^{(n-2)}$ obtained by weighting the reference capacitance C with $1/2^{(n-2)}$ like the above capacitor 506_(n−1) is provided.

A capacitor array 506 is composed of the above multiple capacitors 506_1 to 506_n, and a holding voltage on a corresponding capacitor of the capacitors in this capacitor array 506 is selectively applied sequentially to make a successive comparison between the analog input signal Ain and the reference voltage to be described later.

The right ends of the capacitors 506_1 to 506_(n−1) and the capacitor 506_n are connected to a storage node (SN in FIG. 7) capable of storing electric charge. The left ends of the capacitors 506_1 to 506_(n−1) are connected to terminals O of switch groups 505_1, 505_2 to 505_(n−1), respectively.

Each of the switch groups 505_1, 505_2 to 505_(n−1) has a terminal O common to the respective switch groups and individual terminals C, P, and N corresponding to the terminal O. When a switch 503d_k (where k is a natural number of 1 to (n−1)) is turned on by a control signal CTRL from a controller 501, a short circuit is made between the terminal C and the terminal O.

When a switch 503e_k is turned on, a short circuit is made between the terminal P and the terminal O, while when a switch 503f_k is turned on, a short circuit is made between the terminal N and the terminal O. Note that two or more of the switch 503d_k, the switch 503e_k, and the switch 503f_k are never turned on at the same time.

The terminals C of the switch groups 505_1 to 505_(n−1) and the left end of the capacitor 506_n are connected to the switch 503b and the switch 503c. Then, when the switch 503c is turned on, the terminals C of the switch groups 505_1 to 505_(n−1) and the left end of the capacitor 506_n are coupled to an input node (Ain in FIG. 7).

Further, when the switch 503b is turned on, the terminals C of the switch groups 505_1 to 505_(n−1) and the left end of the capacitor 506_n are coupled to a node of an analog common voltage VC as the reference voltage to be described later.

The terminals P of the switch groups 505_1 to 505_(n−1) are coupled to a node of a positive full-scale reference voltage VRP based on the analog common voltage VC, and the terminals N of the switch groups 505_1 to 505_(n−1) are coupled to a node of a negative full-scale reference voltage VRN based on VC.

The right ends of the capacitors 506_1 to 506_(n−1) and the right end of the capacitor 506_n are connected to a switch 503a and the inverting input terminal of a comparator 504 through the storage node SN. When the switch 503a is turned on, the storage node SN is coupled to the node of the analog common voltage VC. Further, a judging signal DO from the comparator 504 is input into the controller 501 and an output register 502.

The controller 501 is composed of a combinational circuit (logic circuit) and the like, and outputs a control signal CTRL to control switching among the switch groups 505_1 to 505_(n−1) and the switches 503a to 503c.

In other words, the controller 501 generates a control signal CTRL based on the judging signal DO to switch among the switch groups 505_1 to 505_(n−1) sequentially in order to obtain an internal voltage (voltage of the storage node SN) corresponding to the analog input signal Ain.

Further, a trigger clock CLK generated by the controller 501 is supplied to the comparator 504. In synchronization with this trigger clock CLK, the comparator 504 judges a magnitude relationship between the voltage of the storage node SN and the reference voltage VC. When SN<VC, DO=H(1) is output, while when SN>VC, DO=L(0) is output.

The trigger clock CLK from the controller 501 is also supplied to the output register 502, and the judging signal DO is supplied from the comparator 504 to this output register 502.

In synchronization with the trigger clock CLK, the output register 502 holds DN=1 (where N is a natural number of 1 to n) when the judging signal DO=1 from the comparator 504, or holds DN=0 when the judging signal DO=0.

After receiving judging signals D1 to Dn as n output values from the comparator 504, D1 to Dn held as mentioned above are output as a digital output signal Vout from the output register 502.

FIGS. 8A to 8D are charts for describing the operation of the successive approximation A/D converter when the number of bits is six in FIG. 7.

FIG. 8A is a chart showing an example of plotting voltage as judged voltage having an inverted polarity of the voltage of the storage node SN, representing voltage on the ordinate and time on the abscissa. FIG. 8B is a chart showing an example of changes in trigger clock CLK output from the controller 501, representing the judgment timings of the comparator 504 at regular intervals. FIG. 8C is a chart showing an example of values of the judging signal DO of the comparator 504. FIG. 8D is a chart showing an example of a digital output signal Vout output based on the upper 6 bits of judgment results D1 to D6.

Further, FIGS. 8A to 8D represent, as an example, a case where VRP−VC=VC−VRN=VR is assumed, and under this condition, the analog input voltage Ain of an analog input signal where Ain=(10·8/16)×VR is sampled.

As the initial state, when the voltage of the capacitors 506_1 to 506_n follows the analog input voltage Ain, the switch 503a and the switch 503c are on, and the switch 503b is off. Further, in the switch groups, the switches 503d_1 to 503d_(n−1) are on, the switches 503e_1 to 503e_(n−1) and the switches 503f_1 to 503f_(n−1) are off.

At the time of sampling (discretizing) the analog input voltage Ain through the capacitors 506_1 to 506_n, the switch 503a is turned off by the control signal CTRL from the controller 501 and the switch 503c is turned off immediately. After that, the switch 503b is turned on to make the polarity of the sampled analog input voltage Ain inverted and appear on the storage node SN as −Ain. Here, a non-overlapping relationship in which the switch 503b and the switch 503c are not turned on at the same time is established.

Suppose that, after switching among the switches 503a, 503b, and 503c as mentioned above, electric charge is sufficiently redistributed with the parasitic capacitance ignored for convenience sake. In this case, a first judgment rising clock in FIG. 8B (timing of "1st Judge" in FIG. 8A) is input to the comparator 504 at a time when the voltage of the storage node SN converges on −Ain sufficiently. In response to the input of this first judgment rising clock, the comparator 504 compares the voltage of the storage node SN with the reference voltage VC.

This comparison at the comparator 504 directly means the comparison between the voltage of the storage node SN and the reference voltage VC, but as will be easily understood from the above-mentioned phenomenon, it can be considered as a comparison of −Ain (therefore, Ain), which uniquely determines the voltage of the storage node SN in a substantial way, with the reference voltage VC.

Therefore, when −Ain<VC, i.e., Ain>VC, D0=1 is output from the comparator 504, while when −Ain>VC, i.e., Ain<VC, D0=0 is output as the first judgment result.

When the first judgment result mentioned above is D0=1, the controller 501 controls the switch group 505_1 to turn the switch 503d_1 off and the switch 503e_1 on. As a result, the already-mentioned positive full-scale reference voltage VRP is applied to the terminal O, i.e., to the left end of the capacitor 506_1. Therefore, the voltage of the storage node SN comes to −(Ain−VR/2) [V] by the redistribution of electric charge.

On the other hand, when the first judgment result is D0=0, the controller 501 controls the switch group 505_1 to turn the switch 503d_1 off and the switch 503f_1 on. As a result, the negative full-scale reference voltage VRN is applied to the terminal O, i.e., to the left end of the capacitor 506_1. Therefore, the voltage of the storage node SN comes to −(Ain+VR/2) [V] by the redistribution of electric charge.

Similarly, the voltage of the storage node SN and the reference voltage VC are compared at a time when the y-th judgment rising clock (where y is a natural number of 2 to (n−1)) is input, and the switch group 505_y is controlled according to this judgment result.

Then, the voltage of the storage node SN and the reference voltage VC are compared at a time when the (n−1)-th judgment rising clock is input, and after the switch group 505_(n−1) is controlled according to the result, the voltage of the storage node SN and the reference voltage VC are compared at a time when the n-th judgment rising clock is input.

As a result of the successive comparison operations of the comparator 504 mentioned above, the successive comparison operations for 1 to n bits are completed, and n-bit output data is output from the output register 502 as a digital output signal Vout.

As an example, FIG. 8A represents transitions of judged signal when voltage of the storage node SN, VSN=−(10.8/16)×VR, is sampled. Since −(10.8/16)×VR<VC at the first judgment rising clock, D1=1 is output as shown in FIG. 8C. As a result, the switch group 505_1 is so controlled that the voltage of the storage node SN will come to VSN=−(10.8/16)×VR+VR/2=−(2.8/16)×VR.

Since −(2.8/16)×VR<VC at the second judgment rising clock in FIG. 8B (timing of "2nd Judge" in FIG. 8A), D2=1 is output as shown in FIG. 8C. As a result, the switch group 505_2 is so controlled that the voltage of the storage node SN will come to VSN=−(2.8/16)×VR+VR/4=(1.2/16)×VR.

After that, the same processing is repeated up to (n−1) times. When Dn is determined by the n-th judgment rising clock to complete the n-bit successive comparison operation, the output register 502 outputs, based on the stored D1 to Dn, n-bit output data as the output signal Vout.

FIG. 8D is a chart showing an example of a digital output signal Vout output based on the upper 6 bits of the judgment results D1 to D6. As shown in FIG. 8C, the upper 6 bits of the judgment results are D1="1," D2="1," D3="0," D4="1," D5="0," and D6="1." As shown in FIG. 8D, the output register 502 arranges these in order from the highest-order bit and outputs the upper 6 bits, "110101," of the digital output signal Vout. For example, the output register 502 is composed of a shift register and the like.

Like FIGS. 8A to 8D, FIGS. 9A to 9D are charts for describing the operation of the successive approximation A/D converter when the number of bits is six.

As an example, FIG. 9A represents transitions of judged signal when voltage of the storage node SN, VSN=−(10.0/16)×VR, is sampled. Since −(10.0/16)×VR<VC at the first judgment rising clock (timing of "1st Judge" in FIG. 9A), D1=1 is output as shown in FIG. 9C. As a result, the switch group 505_1 is so controlled that the voltage of the storage node SN will come to VSN=−(10.0/16)×VR+VR/2=−(2.0/16)×VR.

Since −(2.0/16)×VR<VC at the second judgment rising clock in FIG. 9B (timing of "2nd Judge" in FIG. 9A), D2=1 is output as shown in FIG. 9C. As a result, the switch group 505_2 is so controlled that the voltage of the storage node SN will comes to VSN=−(2.0/16)×VR+VR/4=(2.0/16)×VR. FIG. 9D is a chart showing an example of the digital output signal Vout output based on the upper 6 bits of the judgment results D1 to D6.

Patent Document 1: JP H02-244823 A
Patent Document 2: JP 2011-061597 A
Patent Document 3: JP 2011-199403 A
Patent Document 4: U.S. Pat. No. 7,834,793
Non-Patent Document 1: Toshikazu Yoneyama, Analog-to-Digital Converter, Ohmsha Ltd. (published in September, 1983), pp. 99-104.

SUMMARY OF THE INVENTION

Problem to be Solved

However, when the same processing is repeated up to three times and the voltage of the storage node SN comes to VSN=−(0.0/16)×VR at the fourth judgment rising clock (timing of "4th Judge" in FIG. 6 and FIG. 9A), the judgment becomes impossible. In other words, the comparator cannot perform the judgment operation and hence there is the possibility of not being able to transit to the next state. As a result, D4, D5, and D6 become indefinite outputs, thus the A/D converter falls into a state of being unable to make the A/D conversion normally.

In such an A/D converter, if a difference between the voltage of the storage node SN and the reference voltage VC is in a level where the comparator cannot judge at a time when the y-th judgment rising clock (where y is a natural number of 1 to n) is input, e.g., 1 LSB or less, the comparator is not able to determine the output, and hence there is a possibility of falling into a metastable state (unstable state). The term "metastable" means such a state that the output signal becomes unstable when the setup time or the hold time in an electronic circuit exceeds a given period of time.

The present invention has been made in view of the circumstances as mentioned above, and it is an object thereof to provide a robust successive approximation A/D converter that has a simple configuration and does not fall into metastable states.

Solution to the Problem

The present invention has been made to achieve the object. According to an aspect of the present invention, there is provided a successive approximation A/D converter including: a capacitor array (106) having multiple capacitors (106_1 to 106_$n$); multiple switch groups (105_1 to 105_$n$-1) connected to the capacitor array (106); a comparator (104) connected to the capacitor array (106) to make a successive comparison in response to timing control signal (CLK) to obtain a judging output signal (DO); and a first controller (101) for generating a control signal (CTRL) to control the multiple switch groups (105_1 to 105_$n$-1) according to the judging output signal (DO) from the comparator (104), wherein when the comparator (104) cannot obtain the judging output signal (DO) at a time of comparison timing by the timing control signal (CLK), the judging output signal (DO) is obtained after a lapse of a predetermined time after the time of the comparison timing (FIG. 1; First Embodiment).

In the above configuration, the successive approximation A/D converter may obtain a digital output (Vout) signal corresponding to an input analog signal (Ain) by a successive comparison of a holding voltage (VSN) on each corresponding capacitor of the multiple capacitors (106_1 to 106_$n$) in the capacitor array (106) with a predetermined reference voltage (VC).

In the above configuration, the capacitor array (106) may have the multiple capacitors (106_1 to 106_$n$) whose one end side is connected to a common conductor.

In the above configuration, each of the multiple switch groups (105_1 to 105_$n$-1) may be connected to the other end of each corresponding capacitor of the multiple capacitors (106_1 to 106_$n$) in the capacitor array (106), and a capacitor to be applied to the successive comparison may be selectively switched sequentially according to a switch group control signal (Ct1) of the control signal (CTRL).

In the above configuration, the comparator (104) may make a successive comparison of a comparison voltage (VSN) based on electric charge held in the capacitor, selected through the multiple switch groups (105_1 to 105_$n$-1), with the predetermined reference voltage (VC) in response to the timing control signal (CLK) to obtain a judging output signal (DO) according to the comparison result.

In the above configuration, the first controller (101) may generate the switch group control signal (Ct1) according to the judging output signal (DO) from the comparator (104).

In the above configuration, the successive approximation A/D converter may further include an output register (102) for determining the most significant bit of the digital output signal (Vout) according to the judging output signal (DO) at the comparator (104).

In the above configuration, the successive approximation A/D converter may further include a counter for arbitrarily setting the predetermined time.

In the above configuration, an asynchronous operation may be performed.

In the above configuration, the successive approximation A/D converter may include a voltage application part (107) for applying a predetermined voltage to the comparison voltage (VSN) or the reference voltage (VC).

In the above configuration, the voltage application part (107) may include a capacitor (106_$x$) whose one end side is connected to the common conductor, and a switch group (103d_$x$, 103e_$x$,) connected to the other end of the capacitor (106_$x$).

In the above configuration, the successive approximation A/D converter may further include a second controller (108) for converting and outputting, to the first controller (101), the judging output signal (DO) from the comparator (104) (FIG. 5; Second Embodiment).

Advantageous Effect of the Invention

According to the present invention, a robust successive approximation A/D converter that has a simple configuration and does not fall into metastable states, compared with the conventional successive approximation A/D converter, can be realized. Further, the successive approximation A/D converter can be realized in a simple circuit configuration, and this can make easy the design in semiconductor integration.

DESCRIPTION OF EMBODIMENTS

Each of embodiments of the present invention will now be described with reference to the drawings.

First Embodiment

Figure 1:
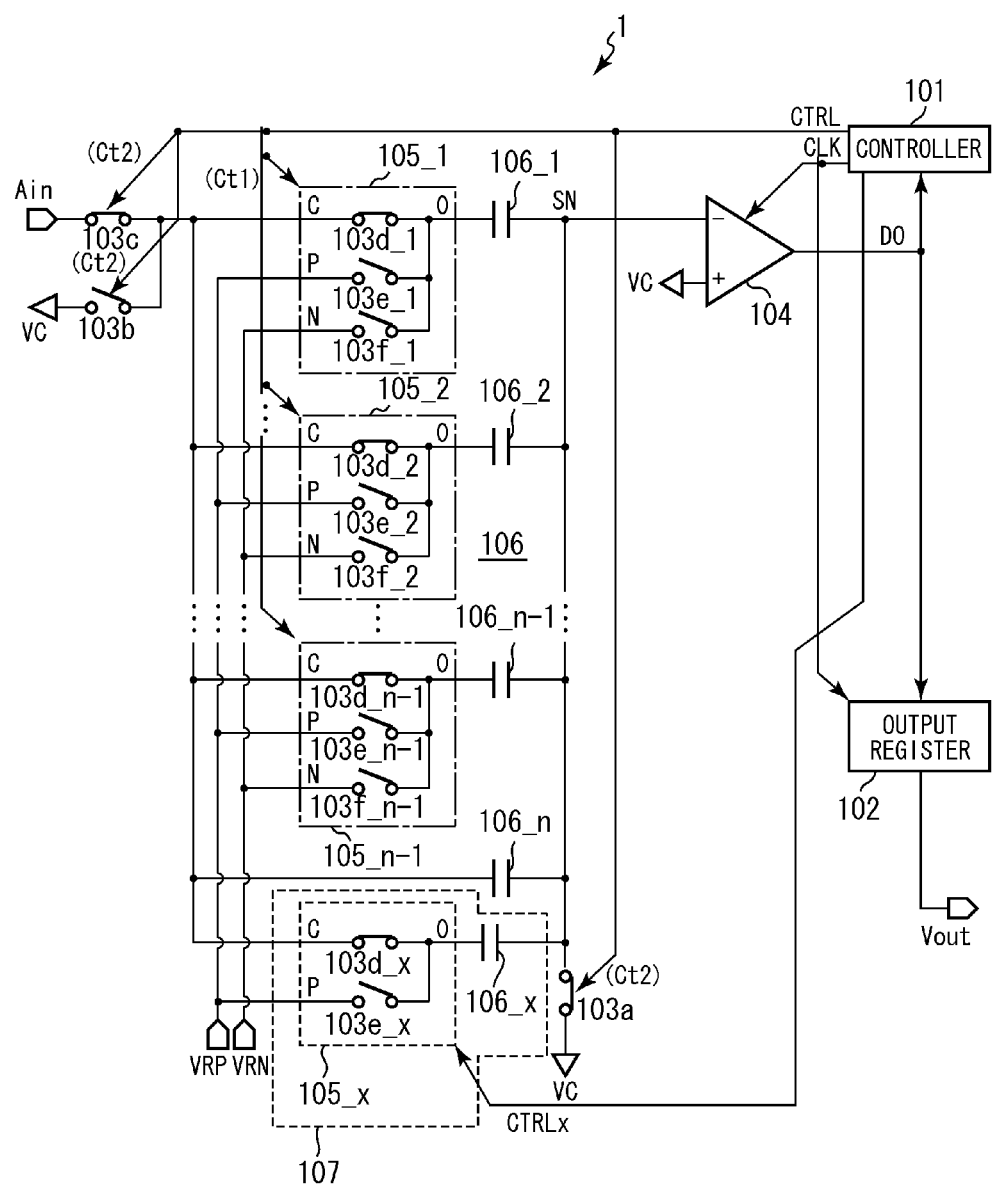
FIG. 1 is a circuit configuration diagram for describing a first embodiment of a successive approximation A/D converter according to the present invention.

FIG. 1 is a circuit configuration diagram for describing a first embodiment of a successive approximation A/D converter according to the present invention.

A successive approximation A/D converter 1 of the first embodiment is an asynchronous successive approximation A/D converter for A/D converting an analog input signal Ain to an n-bit digital output signal Vout (where n is a natural number of 3 or more) to perform an asynchronous operation.

The successive approximation A/D converter 1 of the present invention includes a capacitor array 106 having multiple capacitors each of which is so configured that one end side is connected to a common conductor, respectively. The successive approximation A/D converter makes a successive comparison of a holding voltage on each corresponding capacitor of the multiple capacitors in this capacitor array 106 with a predetermined reference voltage to obtain a digital output signal corresponding to the analog input signal.

Each of multiple switch groups 105_1 to 105_$n$−1 is connected to the other end of each corresponding capacitor of the multiple capacitors 106_1 to 106_$n$ in the capacitor array 106, respectively, to selectively switch a capacitor to be applied to the successive comparison successively in response to a control signal CTRL (a switch group control signal Ct1 thereof).

In other words, the capacitor array 106 has the multiple capacitors 106_1 to 106_$n$, and the multiple switch groups 105_1 to 105_$n$−1 are connected to the capacitor array 106.

A comparator 104 makes a successive comparison of a comparison voltage VSN of a storage node SN based on the holding voltage on a capacitor, selected through the switch groups 105_1 to 105_$n$−1 from among the multiple capacitors 106_1 to 106_$n$ in the capacitor array 106, with a predetermined reference voltage VC in synchronization with a trigger clock CLK for controlling the comparison timing to obtain a judging output signal DO according to the comparison result.

In other words, the comparator 104 is connected to the capacitor array 106 to make a successive comparison in response to the timing control signal CLK to obtain the judging output signal DO. The comparator 104 is configured to make a successive comparison of the comparison voltage VSN based on electric charge held in a capacitor, selected through the multiple switch groups 105_1 to 105_$n$−1, with the predetermined reference voltage VC in response to the timing control signal CLK in order to obtain a judging output signal (DO) according to the comparison result.

A voltage application part 107 applies, to the comparison voltage, a predetermined voltage for a predetermined period based on a control signal CTRLx for controlling the application of voltage when a predetermined time has elapsed after the successive comparison. In other words, the voltage application part 107 applies the predetermined voltage to the comparison voltage VSN or the reference voltage VC.

The voltage application part 107 includes a capacitor 106_$x$ whose one end side is connected to the common conductor, and a switch group 105_$x$ connected to the other end of the capacitor 106_$x$ to switch connection to the predetermined voltage in response to the control signal CTRLx.

An output register 102 determines the most significant bit in the digital output signal Vout according to the judging output signal DO at the comparator 104.

A first controller 101 generates a control signal CTRL (switch group control signal Ct1, form-of-voltage application control signal Ct2), the trigger clock CLK, and the control signal CTRLx in response to the judgment output from the comparator 104.

In other words, the first controller 101 generates the control signal CTRL for controlling the multiple switch groups 105_1 to 105_$n$−1 in response to the judging output signal DO from the comparator 104. The first controller 101 generates the switch group control signal Ct1 according to the judging output signal DO from the comparator 104.

According to such a configuration, when the comparator 104 cannot obtain any judging output signal DO at the time of comparison timing controlled by the timing control signal CLK, the judging output signal DO is obtained after a lapse of a predetermined time after the time of comparison timing.

The capacitor array 106 has the multiple capacitors 106_1 to 106_$n$, each of which is so configured that one end side is connected to the common conductor, respectively, to obtain a digital output signal Vout corresponding to the input analog signal Ain as a result of a successive comparison of a holding voltage VSN on each corresponding capacitor, selected from among the multiple capacitors 106_1 to 106_$n$ in the capacitor array 106, with the predetermined reference voltage VC.

The multiple switch groups 105_1 to 105_$n$−1 is so configured that each switch group is coupled to the other end of each corresponding capacitor of the multiple capacitors 106_1 to 106_$n$ in the capacitor array 106 to selectively switch a capacitor to be applied to the successive comparison successively according to the switch group control signal Ct1 in the control signal CTRL.

Note that a counter (not shown) for arbitrarily setting the predetermined time may be included.

As shown in FIG. 1, one capacitor 106_1 whose capacitance value is set to a predetermined reference capacitance C is provided in the successive approximation A/D converter 1 of the first embodiment. (n−2) capacitors 106_2 to 106_($n$−1) set to have capacitances $C/2$ to $C/2^{(n-2)}$, obtained by weighting the above reference capacitance C with the reciprocals of powers of 2 in a step-by-step manner, are also provided. Further, one capacitor 106_$n$ whose capacitance is set to be $C/2^{(n-2)}-Cx$ and one capacitor 106_$x$ whose capacitance is set to be Cx are provided. Although Cx is set to any value of $0<Cx<C/2^{(n-2)}$, description will be made here in the case of $Cx=(1/4)\times C/2^{(n-2)}$.

For example, in the case of n=6, the capacitances of the capacitors 106_1 to 106_6 and 106_$x$ are C, C/2, C/4, C/8, C/16, $(3/4)\times(C/16)$, and $(1/4)\times(C/16)$, respectively.

Thus, the capacitor array 106 is composed of the multiple capacitors whose capacitance values are weighted with the reciprocals of powers of 2 sequentially in a step-by-step manner by the multiple capacitors 106_1 to 106_$n$, 106_$x$ mentioned above, and each of which is so configured that one end is connected to the common conductor, respectively. The holding voltage on a corresponding capacitor of the capacitors in this capacitor array 106 is selectively applied sequentially to make a successive comparison between the analog input voltage Ain and the reference voltage.

The switch groups 105_1, 105_2 to 105_($n$−1), each of which includes multiple switches (three in each switch group in this example) and corresponds to one end (left end in the example shown) of each of the capacitors 106_1 to 106_($n$−1), are provided.

Each of these switch groups 105_1, 105_2 to 105_($n$−1) has a common terminal O and individual terminals C, P, and N corresponding to the common terminal O, and corresponding switches are provided between the common terminal O and the individual terminals C, P, and N.

In other words, a switch 103$d$_$k$ (where k is a natural number of 1 to (n−1)) is provided between the terminals O and C mentioned above, a switch 103$e$_$k$ is provided between the terminals O and P, and a switch 103$f$_$k$ is provided between the terminals O and N, respectively as shown.

In the example shown, the switch group 105_1 is configured to include three switches, namely a switch 103$d$_1, a switch 103$e$_1, and a switch 103$f$_1. The switch group 105_

(n−1) is configured to include three switches, namely a switch 103d_(n−1), a switch 103e_(n−1), and a switch 103f_(n−1).

The on/off state of each of these switches (switches 103d_k, 103e_k, and 103f_k, where k is a natural number of 1 to (n−1)) in the switch groups 105_1, 105_2 to 105_(n−1) is switched according to the control signal CTRL (the switch group control signal Ct1 thereof) supplied from the first controller 101.

The terminal C and the left end of the capacitor 106_n mentioned above are connected to a node of an analog common voltage VC through a switch 103b in such a manner that they can be electrically switched on and off. The terminal P mentioned above is connected to a node of a positive full-scale reference voltage VRP (positive power supply node) based on the analog common voltage VC, and the terminal N mentioned above is connected to a node of a negative full-scale reference voltage VRN (negative power supply node) based on VC.

The switch group 105_x including multiple switches (two in the first embodiment) is provided at one end (the left end in the example shown) of the capacitor 106_x. This switch group 105_x has a terminal O and terminals C and P, and each corresponding switch is provided between the common terminal O and each individual terminal C, P. In other words, a switch 103d_x is provided between the thermals O and C mentioned above, and a switch 103e_x is provided between the terminals O and P.

The on/off state of each of these switches (switches 103d_x and 103e_x) in the switch group 105_x is switched according to the control signal CTRLx supplied from the first controller 101.

In the first embodiment, the terminal P of the switch group 105_x is connected to the positive full-scale reference voltage VRP, but the present invention is not limited to the example in which the terminal P of the switch group 105_x is connected to the positive full-scale reference voltage VRP. The terminal P of the switch group 105_x can be connected to any voltage to obtain the effects of the present invention. For example, the terminal P of the switch group 105_x may be connected to the negative full-scale reference voltage VRN. Even in this case, the effects of the present invention can be obtained as well.

A switch 103c is provided in parallel to the switch 103b. The right end of this switch 103c is connected to the right end of the switch 103b, and the left end of this switch 103c is connected to an input node to which the analog input signal Ain is input.

On the other hand, each of the other ends (each of the right ends in the example shown) of the capacitors 106_1 to 106_(n−1), and the capacitors 106_n and 106_x is connected to the storage node (SN in FIG. 1) as their common conductor capable of holding electric charge.

The storage node SN is connected to the node of the reference voltage VC through a switch 103a in such a manner that it can be electrically switched on and off. The storage node SN is further connected to the inverting input terminal of the comparator 104, and the non-inverting input terminal of the comparator 104 is electrically connected to the reference voltage node of the reference voltage VC mentioned above.

In other words, the switches 103a to 103c compose a form-of-voltage application switching switch for switching the timing of the holding voltage on each corresponding capacitor and the timing of inverting the polarity of the applied voltage in response to the control signal CTRL (the form-of-voltage application control signal Ct2 thereof), in the above-mentioned successive comparison at the comparator 104.

The first controller 101 supplies the trigger clock CLK to the comparator 104 and the output register 102. In synchronization with this trigger clock CLK for controlling the comparison timing, the comparator 104 judges a magnitude relationship between the voltage VSN of the storage node SN and the reference voltage VC of the reference voltage node. When VSN<VC, the comparator 104 outputs a signal DO=H(1), while when VSN>VC, the comparator 104 outputs a signal DO=L(0) is output. The output signal is supplied to the first controller 101 and the output register 102.

The first controller 101 generates and outputs a control signal CTRL based on the judging signal DO. The switch groups 105_1 to 105_(n−1) are switched sequentially by this control signal CTRL to obtain an internal voltage (the voltage of the storage node SN) corresponding to the analog input signal Ain.

On the other hand, the output register 102 has the function of holding values of signals DO (DO1 to DOn) indicative of the comparison judgment results output from the comparator 104, and the function of outputting an n-bit digital output signal Vout based on the held judgment results DO1 to DOn.

The output register 102 determines the most significant bit (MSB) in the digital output signal Vout according to the judging outputs at the comparator 104.

The term "MSB (Most Significant Bit)" means a bit most weighted in the binary numbers. The binary numbers are generally written with the MSB positioned at the left end and the LSB positioned at the right end. The term "LSB (Least Significant Bit)" means a bit least weighted in the binary numbers. Thus, the binary numbers are generally written with the MSB positioned at the left end and the LSB positioned at the right end.

Figure 7:
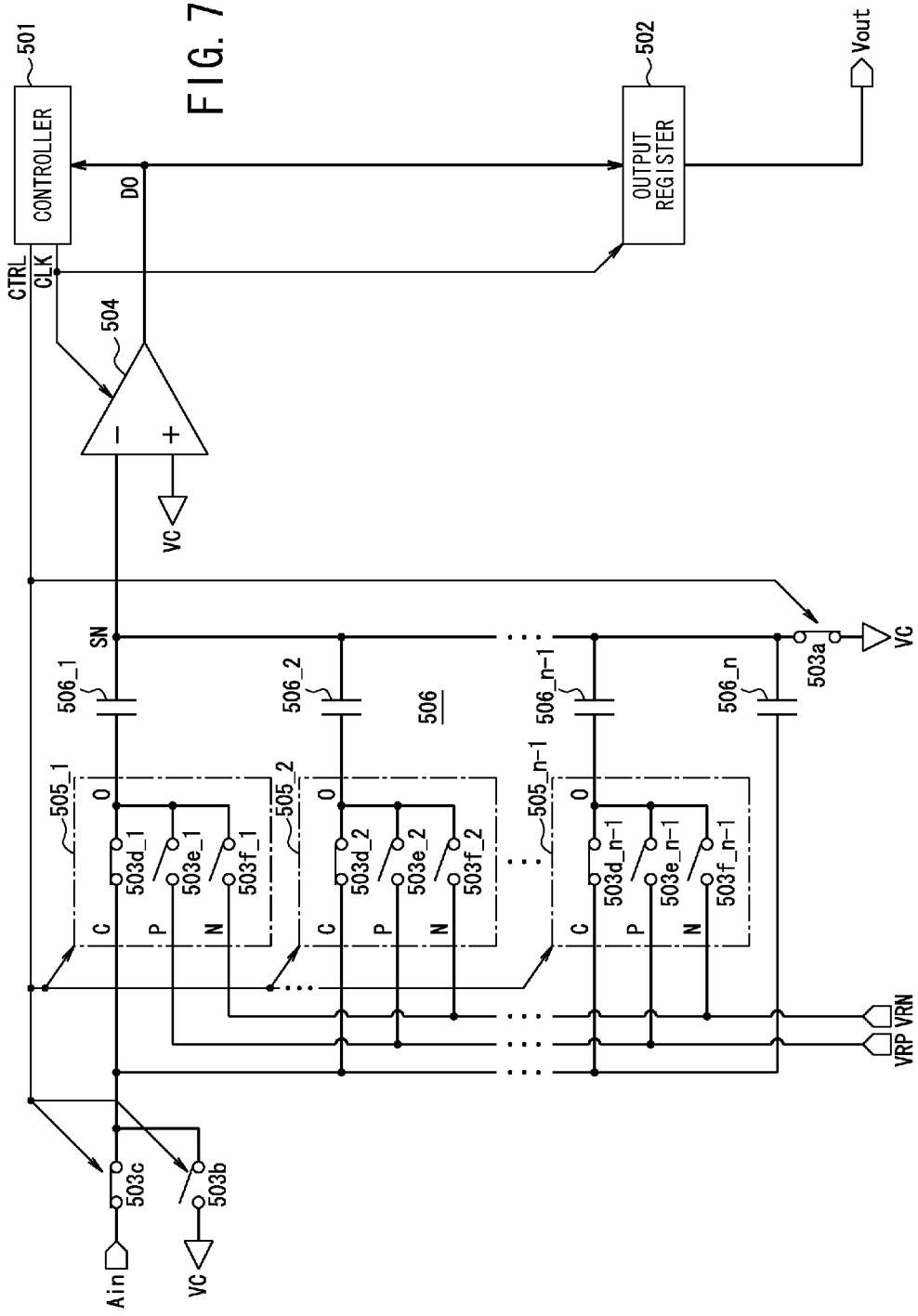
FIG. 7 is a circuit configuration diagram for describing a conventional successive approximation A/D converter.
Figures 8A, 8B, 8C, 8D:
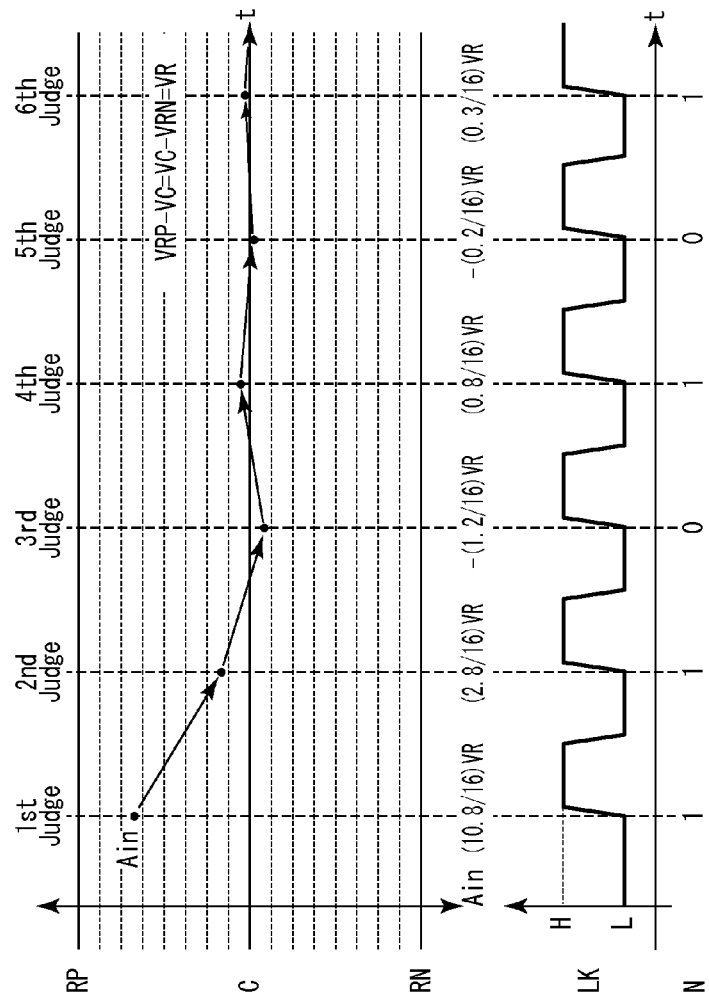
FIGS. 8A to 8D are charts for describing the operation of the successive approximation A/D converter when the number of bits is six in FIG. 7.
Figures 9A, 9B, 9C, 9D:
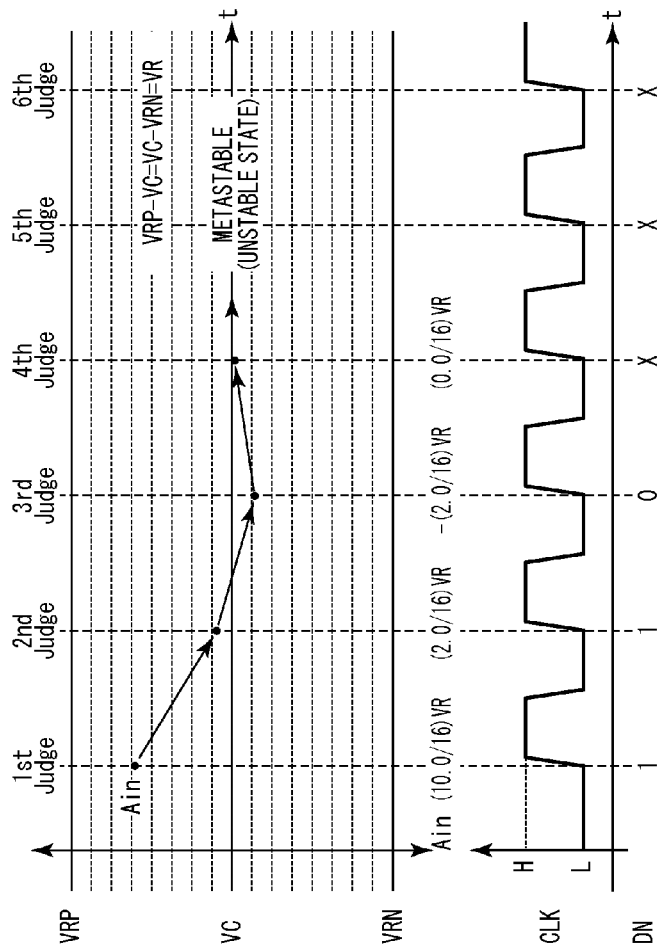
FIGS. 9A to 9D are charts for describing the operation of the successive approximation A/D converter when the number of bits is six like in FIGS. 8A to 8D.

One feature of the successive approximation A/D converter having the above configuration shown in FIG. 1 is as follows. In the conventional technique described with reference to FIG. 7, when an analog input voltage Ain is input, where VSN=VC upon judgment at the comparator 504, i.e., at the rising edge time of the control signal CLK, the comparator 504 falls into a metastable state, and hence there is a possibility that the output becomes indefinite. In contrast, in the first embodiment shown in FIG. 1, when the analog input voltage Ain is input, where VSN=VC upon judgment at the comparator 104, i.e., at the rising edge time of the control signal CLK, the voltage VSN is forcibly changed from VC to $VR/(2^{(n+1)})$ corresponding to charge migration of $(1/4) \times C/2^{(n-2)}$ by transition of the switch group 105_x activated by the control signal CTRLx issued after a lapse of a predetermined period after the rising edge of the control signal CLK, e.g., after 0.5 ns, so that the comparator can judge the difference in potential, getting rid of the metastable state.

The operation of each switch mentioned above will be described more specifically.

The on/off state of each of the switches 103d_1 to 103d_(n−1) is switched according to the control signal CTRL (the switch group control signal Ct1 thereof) from the first controller 101, and in the on state, the terminal C and the terminal O are coupled. This results in connecting the left end of each of the capacitors 106_1 to 106_(n−1) to the left end of the capacitor 106_n, and the right ends of the switches 103b and 103c.

The on/off state of each of the switches 103e_1 to 103e_(n−1) is switched according to the control signal CTRL (the switch group control signal Ct1 thereof) from the first controller 101, and in the on state, the terminal P and the terminal O are coupled. This results in connecting the left end of each of the capacitors 106_1 to 106_(n−1) to the power supply node of the full-scale reference voltage VRP.

The on/off state of each of the switches 103*f*_1 to 103*f*_(*n*−1) is switched according to the control signal CTRL (the switch group control signal Ct1 thereof) from the first controller 101, and in the on state, the terminal N and the terminal O are coupled. This results in connecting the left end of each of the capacitors 106_1 to 106_(*n*−1) to the power supply node of the full-scale reference voltage VRN.

The on/off state of the switch 103*d*__*x* is switched according to the control signal CTRLx from the first controller 101, and in the on state, the terminal C and the terminal O are coupled. This results in connecting the left end of the capacitor 106__*x* to the left end of the capacitor 106__*n*, and the right ends of the switches 103*b* and 103*c*.

The on/off state of the switch 103*e*__*x* is switched according to the control signal CTRLx from the first controller 101, and in the on state, the terminal P and the terminal O are coupled. This results in connecting the left end of the capacitor 106__*x* to the power supply node of the full-scale reference voltage VRP.

On the other hand, the on/off state of the switch 103*a* is switched according to the control signal CTRL (the form-of-voltage application control signal Ct2 thereof) from the first controller 101, and in the on state, the storage node SN is coupled to the power supply node of the reference voltage VC.

The on/off state of the switch 103*c* is switched according to the control signal CTRL (the form-of-voltage application control signal Ct2 thereof) from the first controller 101, and in the on state, the terminal C of each of the switches 103*d*_1 to 103*d*_(*n*−1) is coupled to the input node of the analog input signal Ain.

The on/off state of the switch 103*b* is switched according to the control signal CTRL (the form-of-voltage application control signal Ct2 thereof) from the first controller 101, and in the on state, the terminal C of each of the switches 103*d*_1 to 103*d*_(*n*−1) is coupled to the power supply node of the voltage VC.

The switching operation is so controlled that the switch 103*b* and the switch 103*c* will never become on-state at the same time (non-overlapping control).

In response to the rising edge of the trigger clock CLK from the first controller 101, the comparator 104 compares the voltage VSN of the storage node SN, as the input voltage at the inverting input terminal, with the reference voltage VC of the reference voltage node.

This comparison at the comparator 104 directly means the comparison between the voltage VSN of the storage node SN and the reference voltage VC, but as will be easily understood from the above-mentioned phenomenon, it can be considered as a comparison of −Ain (therefore, Ain), which uniquely determines the voltage of the storage node SN in a substantial way, with the reference voltage VC.

Therefore, when VSN<VC, a high-level signal (DON=1) is output as a judgment output DON (where N is a natural number of 1 to n) from the comparator 104. On the other hand, when VSN≥VC, a low-level signal (DON=0) is output as the judgment output DON.

Figure 2:
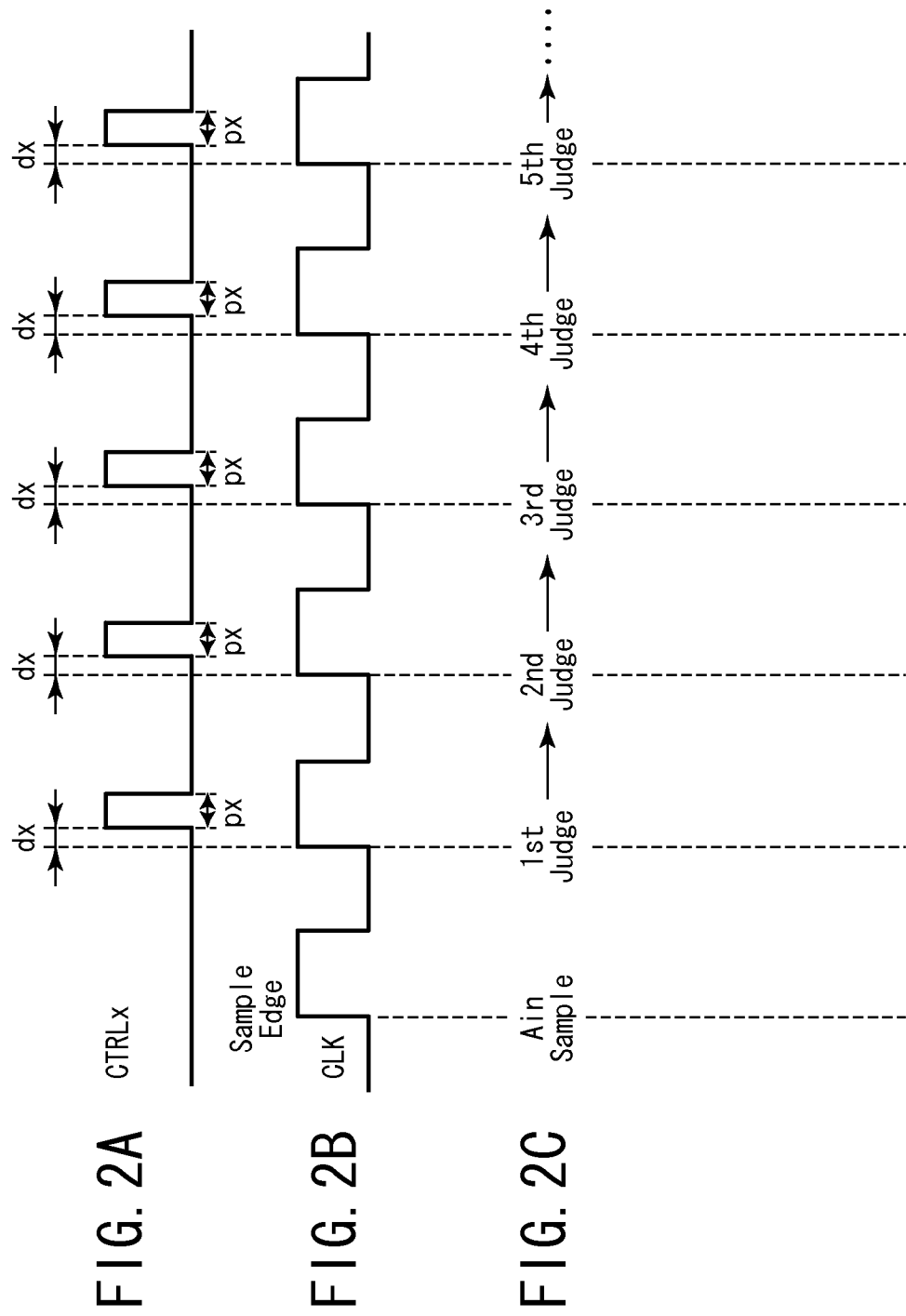
FIGS. 2A to 2C are charts for describing state transitions of the successive approximation converter of the present invention.

FIGS. 2A to 2C are charts for describing state transitions of the successive approximation A/D converter of the present invention.

Based on FIGS. 2A to 2C, description will be made of the trigger clock CLK supplied from the first controller 101 to the comparator 104 and the output register 102, the control signal CTRLx supplied from the first controller 101 to the switch group 105__*x*, and state transitions of the successive approximation A/D converter 1 of the present invention.

FIGS. 2A to 2C represent changes in the control signal CTRLx supplied from the first controller 101 to the switch group 105__*x* in the successive approximation A/D converter 1 of FIG. 1, changes in the trigger clock CLK output from the first controller 101, and state transitions of the successive approximation A/D converter 1.

FIG. 2A shows an example of changes in CTRLx as a control signal output from the first controller 101, FIG. 2B shows an example of changes in the trigger clock CLK as a comparison timing control signal output from the first controller 101, and FIG. 2C shows the state transitions of the successive approximation A/D converter 1 of the present invention that is controlled by the first controller 101.

In FIG. 2B, sampling is done on a sampling edge (referred to as "Sample Edge" in FIG. 2B). Further, VSN and VC are compared by a first judgment rising clock (referred to as "1st Judge" in FIG. 2C). For example, when VSN<VC, D1=1 is output to the output register 102 and to the first controller 101 at the same time, and the control signal CTRL (the switch group control signal Ct1 thereof) is sent to the switch group 105_1 and the voltage of terminal O is set as VRN. The successive approximation operation is performed at and after the second judgment rising clock in the same manner.

The control signal CTRLx shown in FIG. 2A is so characterized that it rises after a lapse of a given time dx after the rising edge of the trigger clock CLK, and falls after a lapse of a given time px after the given time dx. The time dx is set to a time enough to complete the judgment when the comparator 104 does not fall into a metastable state. For example, in the case of a latch type comparator, about 0.5 ns is appropriate. The time px is set to a time enough to propagate disturbance voltage $VR/(2^{(n+1)})$ to the storage node. In the case of n=6, about 0.5 ns is appropriate.

Further, the given times dx and px for the control signal CTRLx can be changed to desired lengths of time, for example, by making the number of counts in a counter (not shown) variable.

When the control signal CTRLx is L, the switch 103*d*__*x* is turned on and the switch 103*e*__*x* is turned off. When the control signal CTRLx is H, the switch 103*d*__*x* is turned off and the switch 103*e*__*x* is turned on. When the control signal CTRLx transits from L to H, voltage $VR/(2^{(n+1)})$ proportional to the capacitor 106__*x* and VC−VRP=−VR is applied to the voltage VSN of the storage node SN. In this case, $VR/(2^{(n+1)})$ as disturbance gets rid of the metastable state of the comparison operation.

Further, when the trigger clock CLK comes to H and VSN and VC are isolated sufficiently within dx not to fall into a metastable state, it is desired to have a mechanism not to override the judgment result written into the output register 102. For example, when the comparator is of a latch type, this function can be implemented by a mechanism for providing a reset signal before each judgment.

FIGS. 3A to 3E are charts for describing the operation of the successive approximation A/D converter of the present invention when the number of bits is six, illustrating transitions of judged voltage VSN (comparison input signal to the comparator 104) related to a certain analog input signal Ain in the successive approximation A/D converter 1 shown in FIG. 1, the trigger clock CLK, values of judging output signal of the comparator 104, and the digital output signal Vout based on the upper 6 bits of judgment results.

Figure 3:
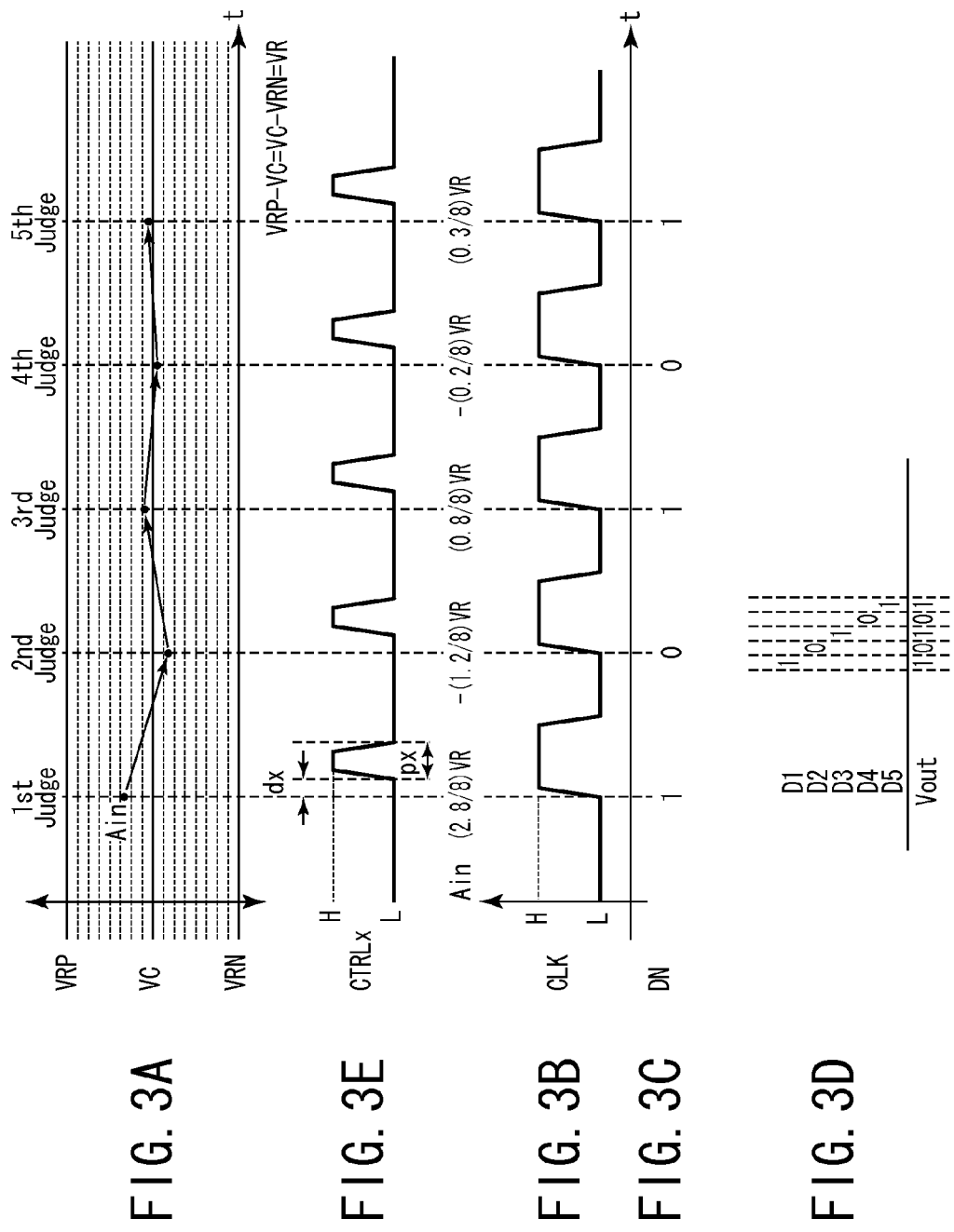
FIGS. 3A to 3E are charts for describing the operation of the successive approximation A/D converter of the present invention when the number of bits is six.

FIG. 3A shows an example of plotting voltage as judged voltage having an inverted polarity of the voltage VSN of the storage node SN. In FIG. 3A, voltage is represented on the ordinate, and time is represented on the abscissa. FIG. 3B shows an example of changes in the trigger clock CLK output from the first controller 101, representing the judgment timings of the comparator 104 at regular intervals. FIG. 3C shows an example of values of the judging signal DO of the comparator 104.

FIGS. 3A to 3E represent, as an example, a case where an analog input voltage Ain of Ain=(2.8/8)×VR is sampled.

As the initial state, when the voltage of the capacitors 106_1 to 106_*n* follows the analog input voltage Ain, the switch 103*a* and the switch 103*c* are on and the switch 103*b* is off according to the control signal CTRL (the form-of-voltage application control signal Ct2 thereof) supplied from the first controller 101.

The switches 103*d*_1 to 103*d*_(*n*−1) are on, and the switches 103*e*_1 to 103*e*_(*n*−1) and 103*f*_1 to 103*f*_(*n*−1) are off in the switch groups 105_1 to 105_(*n*−1), according to the control signal CTRL (the switch group control signal Ct1 thereof) supplied from the first controller 101.

At the time of sampling (discretizing) the analog input voltage Ain through the capacitors 106_1 to 106_*n*, the switch 103*a* is turned off and the switch 103*c* is turned off immediately by the control signal CTRL (the form-of-voltage application control signal Ct2 thereof). After that, the switch 103*b* is turned on to make the polarity of the sampled Ain inverted and appear on the storage node SN as −Ain [V].

As mentioned above, a non-overlapping relationship in which the switch 103*b* and the switch 103*c* are not turned on at the same time is established.

Suppose that, after switching among the switches, electric charge is sufficiently redistributed with the parasitic capacitance ignored for convenience sake. A first judgment rising clock of the trigger clock CLK in FIG. 3B (timing referred to as "1st Judge" in FIG. 3A) is input to the comparator 104 at a time when the voltage of the storage node SN converges on −Ain sufficiently.

In response to the input of this first judgment rising clock, the comparator 104 compares the voltage VSN of the storage node SN with the reference voltage VC.

As mentioned above, this comparison at the comparator 104 directly means the comparison between the voltage VSN of the storage node SN and the reference voltage VC, but as will be easily understood from the above-mentioned phenomenon, it can be considered as a comparison of −Ain (therefore, Ain), which uniquely determines the voltage of the storage node SN in a substantial way, with the reference voltage VC.

When −Ain<VC, i.e., Ain>VC, DO=1 is output from the comparator 104, while when −Ain>VC, i.e., Ain<VC, DO=0 is output.

When this first judgment result is DO=1, the first controller 101 controls the switch group 105_1 to turn the switch 103*d*_1 off and the switch 103*e*_1 on. As a result, the voltage VSN of the storage node SN comes to −(Ain−VR/2) [V] by the redistribution of electric charge.

On the other hand, when the first judgment result is DO=0, the switch group 105_1 is controlled by the control signal CTRL (the switch group control signal Ct1 thereof) from the first controller 101 to turn the switch 103*d*_1 off and the switch 103*f*_1 on. As a result, the voltage VSN of the storage node SN comes to (Ain+VR/2) [V] by the redistribution of electric charge.

Next, a second judgment rising clock of the trigger clock CLK in FIG. 3B (timing referred to as "2nd Judge" in FIG. 3A) is input to the comparator 104.

In response to the input of this second judgment rising clock, the comparator 104 compares the voltage VSN of the storage node SN with the reference voltage VC. As a result, when −Ain<VC, i.e., Ain>VC, DO=1 is output from the comparator 104, while when −Ain>VC, i.e., Ain<VC, DO=0 is output.

When this second judgment result is DO=1, the first controller 101 controls the switch group 105_2 to turn the switch 103*d*_2 off and the switch 103*e*_2 on. As a result, the voltage VSN of the storage node SN comes to −(Ain−VR/4) [V] by the redistribution of electric charge.

On the other hand, when the second judgment result is DO=0, the switch group 105_2 is controlled by the control signal CTRL (the switch group control signal Ct1 thereof) from the first controller 101 to turn the switch 103*d*_2 off and the switch 103*f*_2 on. As a result, the voltage VSN of the storage node SN becomes −(Ain+VR/4) [V] by the redistribution of electric charge.

Similarly, the voltage VSN of the storage node SN and the reference voltage VC are compared at a time when the y-th judgment rising clock (where y is a natural number of 3 to n) is input, and the switch group 105_(*y*−2) is controlled according to this judgment result.

Then, the voltage VSN of the storage node SN and the reference voltage VC are compared at a time when the n-th judgment rising clock is input, and after the switch group 105_(*n*−1) is controlled according to the result, the voltage VSN of the storage node SN and the reference voltage VC are compared at the time when the n-th judgment rising clock is input.

Thus, successive comparison operations for 1 to n bits are completed, and an n-bit output data Vout as the A/D conversion results is output from the output register 102.

As mentioned above, in FIG. 3A referred to, transitions of judged signal are represented when the voltage VSN of the storage node SN is sampled as VSN=−(2.8/8)×VR as an example.

Among the trigger clocks CLK in FIG. 3B, since −(2.8/8)×VR<VC at the time when the above-mentioned first judgment rising clock is input to the comparator 104, D1=1 is output as shown in FIG. 3C.

As a result, the switch group 105_1 is controlled by the control signals CTRL (the switch group control signal Ct1 thereof) from the first controller 101, resulting in VSN=−(2.8/8)×VR+VR/2=(1.2/8)×VR. Then, since (1.2/8)×VR>VC at the time when the second judgment rising clock is input to the comparator 104, D2=0 is output as shown in FIG. 3C. As a result, the switch group 105_2 is so controlled that the voltage VSN of the storage node SN will come to VSN=(1.2/8)×VR−VR/4=−(0.8/8)×VR.

Next, among the trigger clocks CLK in FIG. 3B, a third judgment rising clock (timing referred to as "3rd Judge" in FIG. 3A) is input to the comparator 104.

In response to the input of this third judgment rising clock, the comparator 104 compares the voltage VSN of the storage node SN with the reference voltage VC. Since −(0.8/8)×VR<VC in this comparison, D3=1 is output as shown in FIG. 3C. As a result, the switch group 105_3 is so controlled that the voltage of the storage node SN will come to VSN=−(0.8/8)×VR−VR/8=(0.2/8)×VR.

After this, when the same processing is repeated up to n times, D(n+1) is determined by the (n+1)-th judgment rising clock, and the (n+1)-bit successive comparison operation is completed, the output register 102 outputs an (n+1)-bit digital output data Vout based on the stored D1 to D(n+1).

FIG. 3D is a chart showing an example of a digital output signal Vout output based on the upper 5 bits of the judgment results D1 to D5. As shown in FIG. 3C, the upper 5 bits of the judgment results are D1="1," D2="0," D3="1," D4="0," and D5="1." As shown in FIG. 3D, the output register 102 arranges these in order from the highest-order bit, and outputs the upper 5 bits, "10101," of the digital output signal Vout. For example, the output register 102 is composed of a shift register and the like.

FIG. 3E is a timing chart representing the control signal CTRLx.

The description is made of a case where the comparator 104 has a mechanism not to override the judgment results written into the output register 102. For example, when the comparator is of a latch type, this function can be implemented by a mechanism for providing a reset signal before each judgment.

When there is a sufficient difference between the voltage VSN of the storage node SN and the reference voltage VC, i.e., when there is a difference of 1 LSB or more as an example, since the delay time dx is set to a time enough for the comparator 104 to be able to complete the judgment, the judgment is never overridden by the disturbance voltage $(1/128) \times VR$ applied on the rising edge of the control signal CTRLx.

FIGS. 4A to 4E are charts for describing the operation of the successive approximation A/D converter of the present invention when the number of bits is six, illustrating transitions of judged voltage VSN (comparison input signal to the comparator 104) related to a certain analog input signal Ain in the successive approximation A/D converter 1 shown in FIG. 1, the trigger clock CLK, values of judging output signal of the comparator 104, and outputs based on the upper 6 bits of judgment results.

Figure 4:
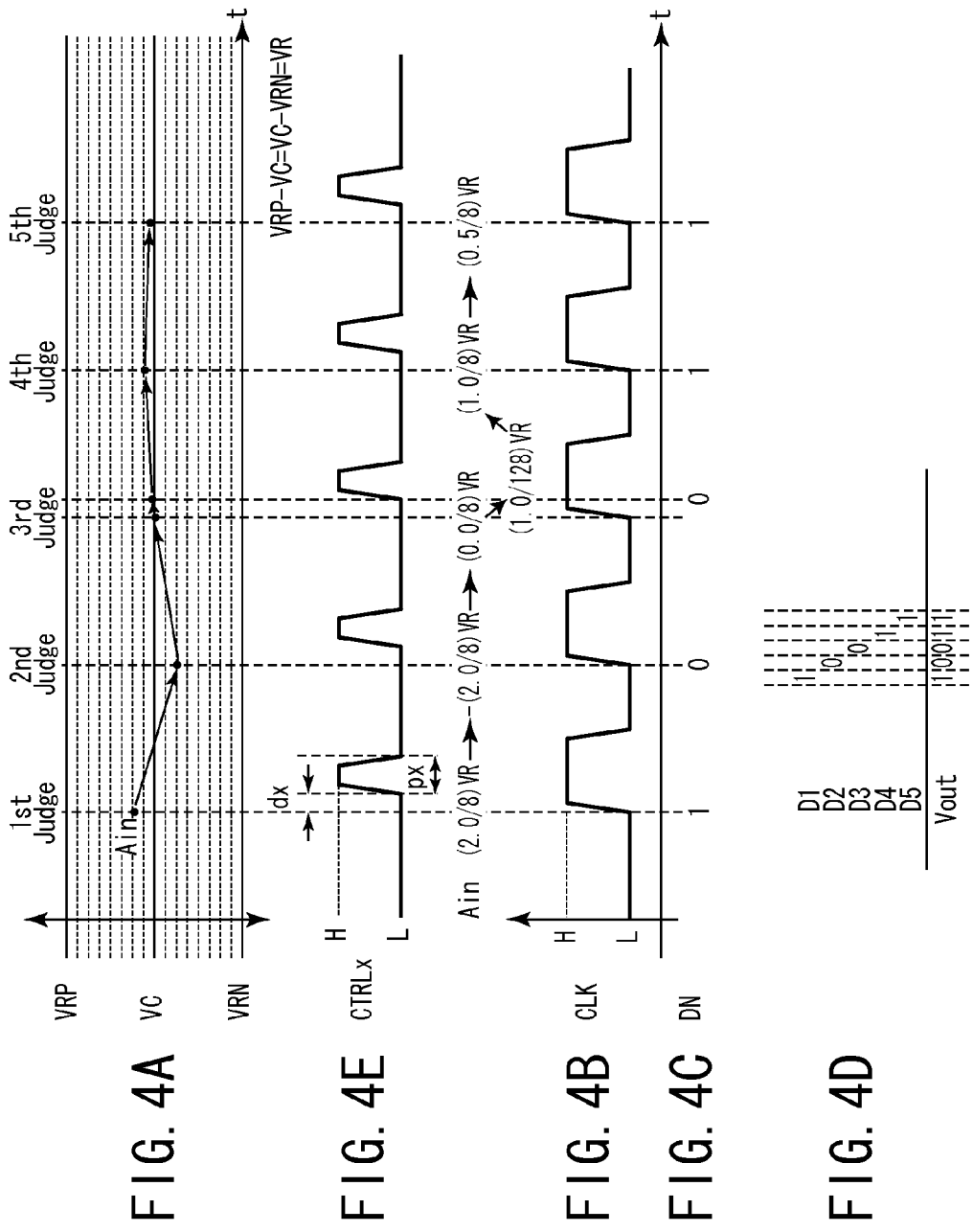
FIGS. 4A to 4E are charts for describing the operation of the successive approximation A/D converter of the present invention when the number of bits is six.

FIG. 4A shows an example of plotting voltage as judged voltage having an inverted polarity of the voltage VSN of the storage node SN. In FIG. 4A, voltage is represented on the ordinate, and time is represented on the abscissa. FIG. 4B shows an example of changes in the trigger clock CLK output from the first controller 101, representing the judgment timings of the comparator 104 at regular intervals. FIG. 4C shows an example of values of the judging signal DO of the comparator 104.

FIG. 4B represents, as an example, a case where an analog input voltage Ain of $Ain=(2.0/8) \times VR$ is sampled.

As the initial state, when the voltage of the capacitors 106_1 to 106_n follows the analog input voltage Ain, the switch 103a and the switch 103c are on and the switch 103b is off according to the control signal CTRL (the form-of-voltage application control signal Ct2 thereof) supplied from the first controller 101.

The switches 103d_1 to 103d_(n−1) are on and the switches 103e_1 to 103e_(n−1) and 103f_1 to 103f_(n−1) are off in the switch groups 105_1 to 105_(n−1), according to the control signal CTRL (the switch group control signal Ct1 thereof) supplied from the first controller 101.

At the time of sampling (discretizing) the analog input voltage Ain through the capacitors 106_1 to 106_n, the switch 103a is turned off and the switch 103c is turned off immediately by the control signal CTRL (the form-of-voltage application control signal Ct2 thereof). After that, the switch 103b is turned on to make the polarity of the sampled Ain inverted and appear on the storage node SN as −Ain [V].

As mentioned above, a non-overlapping relationship in which the switch 103b and the switch 103c are not turned on at the same time is established.

Suppose that, after switching among the switches, electric charge is sufficiently redistributed with the parasitic capacitance ignored for convenience sake. A first judgment rising clock of the trigger clock CLK in FIG. 4B (timing referred to as "1st Judge" in FIG. 4A) is input to the comparator 104 at a time when the voltage of the storage node SN converges on −Ain sufficiently. In response to the input of this first judgment rising clock, the comparator 104 compares the voltage VSN of the storage node SN with the reference voltage VC.

As mentioned above, this comparison at the comparator 104 directly means the comparison between the voltage VSN of the storage node SN and the reference voltage VC, but as will be easily understood from the above-mentioned phenomenon, it can be considered as a comparison of −Ain (therefore, Ain), which uniquely determines the voltage of the storage node SN in a substantial way, with the reference voltage VC.

When −Ain<VC, i.e., Ain>VC, DO=1 is output from the comparator 104, while when −Ain>VC, i.e., Ain<VC, DO=0 is output.

When this first judgment result is DO=1, the first controller 101 controls the switch group 105_1 to turn the switch 103d_1 off and the switch 103e_1 on. As a result, the voltage VSN of the storage node SN comes to −(Ain−VR/2) [V] by the redistribution of electric charge.

On the other hand, when the first judgment result is DO=0, the switch group 105_1 is controlled by the control signal CTRL (the switch group control signal Ct1) from the first controller 101 to turn the switch 103d_1 off and the switch 103f_1 on. As a result, the voltage VSN of the storage node SN becomes −(Ain+VR/2) [V] by the redistribution of electric charge.

Next, a second judgment rising clock of the trigger clock CLK in FIG. 4B (timing referred to as "2nd Judge" in FIG. 4A) is input to the comparator 104.

In response to the input of this second judgment rising clock, the comparator 104 compares the voltage VSN of the storage node SN with the reference voltage VC. As a result, when −Ain<VC, i.e., Ain>VC, DO=1 is output from the comparator 104, while when −Ain>VC, i.e., Ain<VC, DO=0 is output.

When this second judgment result is DO=1, the first controller 101 controls the switch group 105_2 to turn the switch 103d_2 off and the switch 103e_2 on. As a result, the voltage VSN of the storage node SN comes to −(Ain−VR/4) [V] by the redistribution of electric charge.

On the other hand, when the second judgment result is DO=0, the switch group 105_2 is controlled by the control signal CTRL (the switch group control signal Ct1 thereof) from the first controller 101 to turn the switch 103d_2 off and the switch 103f_2 on. As a result, the voltage VSN of the storage node SN comes to −(Ain+VR/4) [V] by the redistribution of electric charge.

Similarly, the voltage VSN of the storage node SN and the reference voltage VC are compared at a time when the y-th judgment rising clock (where y is a natural number of 3 to n) is input, and the switch group 105_(y−2) is controlled according to this judgment result.

Then, the voltage VSN of the storage node SN and the reference voltage VC are compared at a time when the n-th judgment rising clock is input, and after the switch group 105_(n−1) is controlled according to the result, the voltage VSN of the storage node SN and the reference voltage VC are compared at the time when the n-th judgment rising clock is input.

Thus, successive comparison operations for 1 to n bits are completed, and an n-bit output data Vout as the A/D conversion results is output from the output register 102.

As mentioned above, in FIG. 4A referred to, transitions of judged signal are represented when the voltage VSN of the storage node SN is sampled as $VSN=-(2.0/8) \times VR$ as an example.

Among the trigger clocks CLK in FIG. 4B, since −(2.0/8)× VR<VC at the time when the above-mentioned first judgment rising clock is input to the comparator 104, D1=1 is output as shown in FIG. 4C.

As a result, the switch group 105_1 is controlled by the control signal CTRL (the switch group control signal Ct1 thereof) from the first controller 101, resulting in VSN=−(2.0/8)×VR+VR/2=(2.0/8)×VR. Then, since (2.0/8)×VR>VC at the time when the second judgment rising clock is input to the comparator 104, D2=0 is output as shown in FIG. 4C. As a result, the switch group 105_2 is so controlled that the voltage VSN of the storage node SN will come to VSN=(2.0/8)×VR−VR/4=(0.0/8)×VR.

Next, among the trigger clocks CLK in FIG. 4B, a third judgment rising clock (timing referred to as "3rd Judge" in FIG. 4A) is input to the comparator 104.

In response to the input of this third judgment rising clock, the comparator 104 compares the voltage VSN of the storage node SN with the reference voltage VC. In this comparison, since (0.0/8)×VR<1 LSB, it transits to VSN=(1/128)×VR due to disturbance applied on the rising edge of the control signal CTRLx in FIG. 4E. Since VSN=(1/128)×VR>VC, D3=0 is output as shown in FIG. 4C. As a result, the switch group 105_3 is so controlled that the voltage of the storage node SN will become VSN=(0.0/8)×VR−VR/8=−(1.0/8)×VR.

After this, when the same processing is repeated up to n times, D(n+1) is determined by the (n+1)-th judgment rising clock, and the (n+1)-bit successive comparison operation is completed, the output register 102 outputs (n+1)-bit digital output data based on the stored D1 to D(n+1) as a digital output signal Vout.

FIG. 4D is a chart showing an example of a digital output signal Vout output based on the upper 5 bits of the judgment results D1 to D5. As shown in FIG. 4C, the upper 5 bits of the judgment results are D1="1," D2="0," D3="0," D4="1," and D5="1." As shown in FIG. 4D, the output register 102 arranges these in order from the highest-order bit, and outputs the upper 5 bits, "10011," of the digital output data as a digital output signal Vout. For example, the output register 102 is composed of a shift register and the like.

FIG. 4E represents a timing chart of the control signal CTRLx. In response to the input of the third judgment rising clock, the comparator 104 compares the voltage VSN of the storage node SN with the reference voltage VC. In this comparison, since (0.0/8)×VR<1 LSB, the comparator 104 cannot perform the judgment operation and temporarily falls into a metastable state. However, a transition to VSN=(1/128)×VR is so made due to disturbance applied at the rising timing of the control signal CTRLx in FIG. 4E, resulting in VSN=(1/128)×VR>VC and hence getting rid of the metastable state.

In the first embodiment, the description has been made of the case where the left end of the switch 103e_x is connected to the power supply node of the positive full-scale reference voltage VRP and the disturbance (1/128)×VR is positive. Since the disturbance is positive, DN="10011" in FIG. 4C, but if the disturbance is negative, i.e., when the left end of the switch 103e_x is connected to the power supply node of the negative full-scale reference voltage VRN, DN="10100."

Since both judgment results are brought in the case of input of an effective resolution or less (1 LSB or less) as the A/D converter, both of DN="10011" and DN="10100" are not factors that degrade the characteristics of the A/D converter.

The left end of the switch 103e_x may be connected to a node from which the positive full-scale reference voltage VRP and the negative full-scale reference voltage VRN are output at random, or the left end of the switch 103e_x may be connected to a node from which dither is output.

In the first embodiment, the description has been made of the case where the disturbance voltage is applied to the voltage VSN of the storage node SN, but the disturbance voltage may be applied to the reference voltage VC.

As described above, in the successive approximation A/D converter of the first embodiment, a robust successive approximation A/D converter can be provided in a simple configuration compared with the conventional. Further, the successive approximation A/D converter can be realized in a simple circuit configuration, and this can make easy the design in semiconductor integration.

Second Embodiment

Referring next to the drawings, a second embodiment of the present invention will be described.

Figure 5:
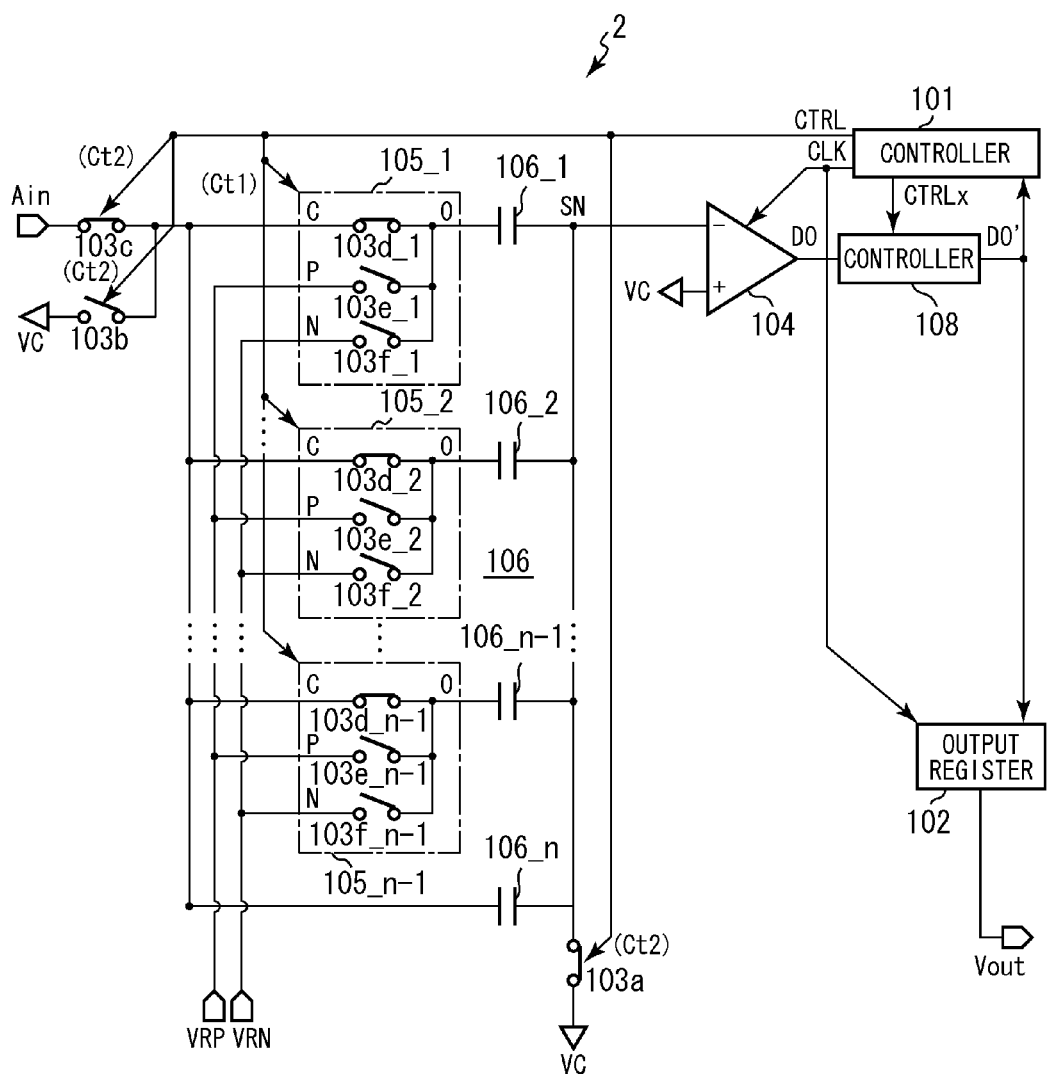
FIG. 5 is a circuit configuration diagram for describing a second embodiment of a successive approximation A/D converter according to the present invention.

FIG. 5 is a circuit configuration diagram for describing a second embodiment of a successive approximation A/D converter according to the present invention.

In comparison with the successive approximation A/D converter 1 of the first embodiment shown in FIG. 1, a successive approximation A/D converter 2 of the second embodiment is different in including a second controller 108 instead of the voltage application part 107. In the following description, components having the same functions as those in the successive approximation A/D converter 1 of the first embodiment shown in FIG. 1 are given the same reference numerals to omit redundant description.

In other words, the successive approximation A/D converter of the second embodiment includes the second controller 108 for converting and outputting, to the first controller 101, a judging output signal DO from the comparator 104 to A/D convert an analog input signal Ain to an n-bit digital output signal Vout (where n is a natural number of 3 or more).

In response to a control signal CTRLx from the first controller 101, the second controller 108 generates a judgment output DO' from the judging signal DO from the comparator 104.

In response to the judgment output DO' from the second controller 108, the first controller 101 generates the control signals CTRL (switch group control signal Ct1, form-of-voltage application control signal Ct2), the trigger clock CLK, and the control signal CTRLx.

The first controller 101 supplies the trigger clock CLK to the comparator 104 and the output register 102, and the control signal CTRLx to the second controller 108.

In synchronization with this trigger clock CLK for controlling the comparison timing, the comparator 104 judges a magnitude relationship between the voltage VSN of the storage node SN and the reference voltage VC of the reference voltage node. When VSN<VC, the comparator 104 outputs a signal DO=H(1), while when VSN>VC, the comparator 104 outputs a signal DO=L(0). The output signal is supplied to the second controller 108.

The second controller 108 has the function of outputting DO'=DO when a value (DO1 to DOn) of judging signal DO indicative of a comparison judgment result output from the comparator 104 is H or L, or forcibly outputting DO'="0" or "1" when the value of the judging signal DO is indefinite and the second controller 108 is triggered by the control signal CTRLx.

The output register 102 has the function of holding the value of the signal DO' output from the second controller 108, and the function of outputting an n-bit digital output signal Vout based on the judgment results held therein.

One feature of the successive approximation A/D converter having the above configuration shown in FIG. 5 is as follows. In the conventional technique described with reference to FIG. 7, when an analog input voltage Ain is input, where VSN=VC upon judgment at the comparator 504 i.e., at the rising edge time of the control signal CLK, the comparator 504 falls into a metastable state and hence there is a possibility that the output becomes indefinite. In contrast, in the second embodiment shown in FIG. 5, when the analog input voltage Ain is input, where VSN=VC upon judgment at the comparator 104, i.e., at the rising edge time of the control signal CLK, the value of "0" or "1" is forcibly output by the second controller 108 activated by the control signal CTRLx issued after a lapse of a predetermined period after the rising edge of the control signal CLK, e.g., after 0.5 ns, instead of outputting the judging signal DO having an indefinite value, thereby getting rid of the metastable state.

FIGS. 6A to 6E are chart for describing the operation of the successive approximation A/D converter of the present invention when the number of bits is six, illustrating transitions of judged voltage VSN (comparison input signal to the comparator 104) related to a certain analog input signal Ain in the successive approximation A/D converter 2 shown in FIG. 5, the trigger clock, values of judging output signal of the comparator 104, and outputs based on the upper 6 bits of judgment results. In the following, since the operation of successive approximation A/D converter 2 of the second embodiment is the same as that up to the second judgment shown in FIGS. 4A to 4E, the description thereof will be omitted.

Figure 6:
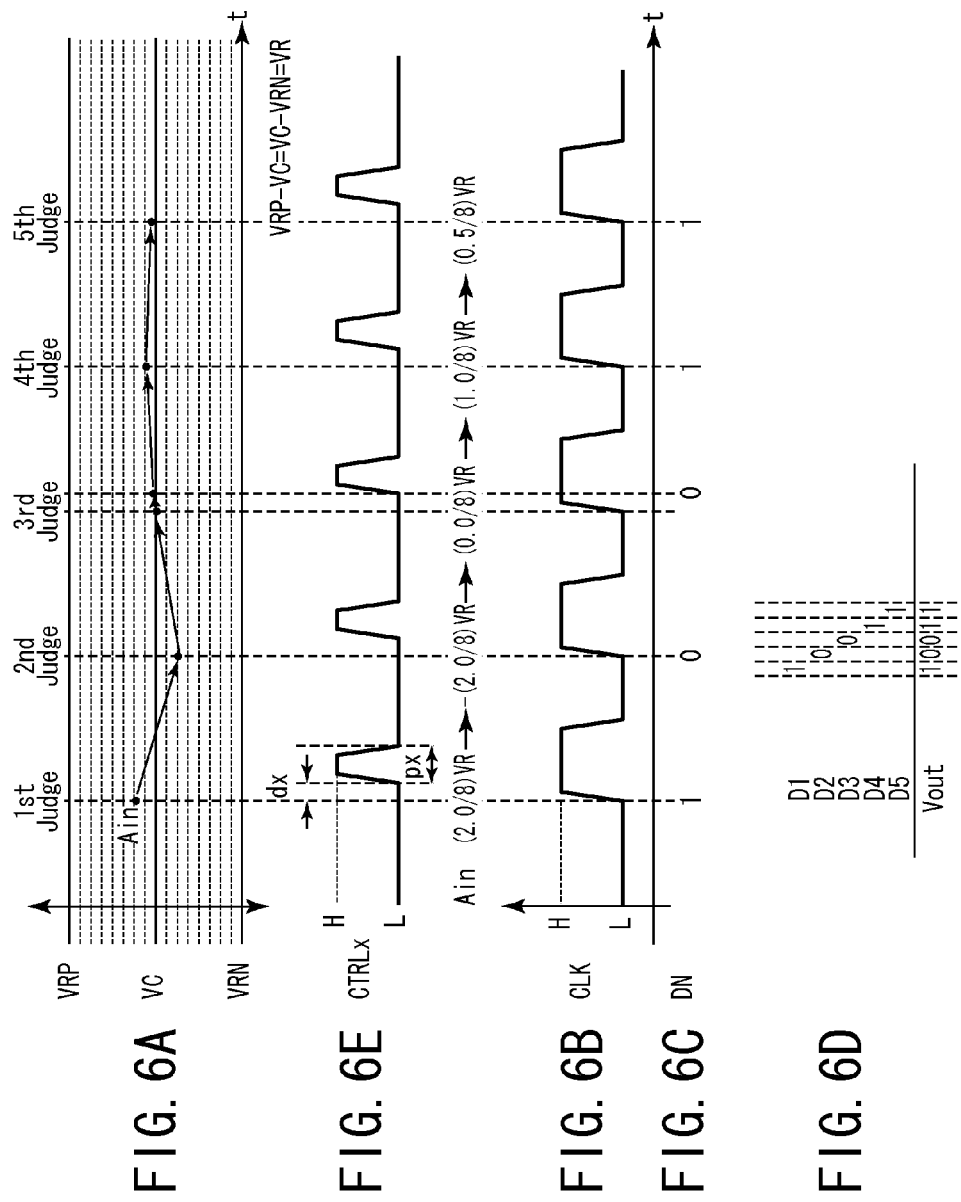
FIGS. 6A to 6E are charts for describing the operation of the successive approximation A/D converter of the present invention when the number of bits is six.

FIG. 6A is shows an example of plotting voltage as judged voltage having an inverted polarity of the voltage VSN of the storage node SN. In FIG. 6A, voltage is represented on the ordinate, and time is represented on the abscissa. FIG. 6B shows an example of changes in the trigger clock CLK output from the first controller 101, representing the judgment timings of the comparator 104 at regular intervals. FIG. 6C is a chart showing an example of values of the judging signal DO' of the controller 108.

Among the trigger clocks CLK in FIG. 6B, a third judgment rising clock (timing referred to as "3rd Judge" in FIG. 6A) is input to the comparator 104.

In response to the input of this third judgment rising clock, the comparator 104 compares the voltage VSN of the storage node SN with the reference voltage VC. In this comparison, since (0.0/8)×VR<1 LSB, the judging signal DO is converted to 0 by the second controller 108 at the rising timing of the control signal CTRLx in FIG. 6E, and D3=0 is output as shown in FIG. 6C. As a result, the switch group 105_3 is so controlled that the voltage of the storage node SN will come to VSN=(0.0/8)×VR−VR/8=−(1.0/8)×VR.

After this, when the same processing is repeated up to n times, D(n+1) is determined by the (n+1)-th judgment rising clock and the (n+1)-bit successive comparison operation is completed, the output register 102 outputs (n+1)-bit digital output data based on the stored D1 to D(n+1) as a digital output signal Vout.

FIG. 6D is a chart showing an example of a digital output signal Vout output based on the upper 5 bits of the judgment results D1 to D5. As shown in FIG. 6C, the upper 5 bits of the judgment results are D1="1," D2="0," D3="0," D4="1," and D5="1."

FIG. 6E represents a timing chart of the control signal CTRLx. In response to the input of the third judgment rising clock, the comparator 104 compares the voltage VSN of the storage node SN with the reference voltage VC. In this comparison, since (0.0/8)×VR<1 LSB, the comparator 104 cannot perform the judgment operation and temporarily falls into a metastable state. However, the judging signal DO is converted to 0 by the second controller 108 at the rising timing of the control signal CTRLx in FIG. 6E, getting rid of the state of the indefinite value due to the metastable state.

In the second embodiment, the description has been made of the case where the conversion to "0" is made by the second controller 108. Therefore, DN="10011" in FIG. 6C. However, when a conversion to "1" is made, DN="10100."

Since both judgment results are brought in the case of input of an effective resolution or less (1 LSB or less) as the A/D converter, both of DN="10011" and DN="10100" are not factors that degrade the characteristics of the A/D converter.

As described above, in the successive approximation A/D converter of the second embodiment, a robust successive approximation A/D converter that does not fall into metastable states can be provided in a simple configuration compared with the conventional. Further, the successive approximation A/D converter can be realized in a simple circuit configuration, and this can make easy the design in semiconductor integration.

REFERENCE SIGNS LIST 1, 2 Successive Approximation A/D Converter
101 First Controller
102, 502 Output Register
103a to 103c, 103d_1 to 103f_n−1, 103d_x, 103e_x, 503a to 503c, 503d_1 to 503f_n−1 Switch
104, 504 Comparator
105_1 to 105_n−1, 505_1 to 505_n−1 Switch Group
106, 506 Capacitor Array
106_1 to 106_n, 106_x, 506_1 to 506_n Capacitor
107 Voltage Application Part
108 Second Controller
501 Controller

The invention claimed is:

1. A successive approximation A/D converter comprising:
a capacitor array having a plurality of capacitors;
a plurality of switch groups connected to the capacitor array;
a comparator connected to the capacitor array to make a successive comparison of a comparison voltage based on electric charge held in each of the plurality of capacitors, selected through the plurality of switch groups, with a predetermined reference voltage in response to a timing control signal to obtain a judging output signal;
a voltage application part for applying a predetermined voltage to the comparison voltage; and
a first controller for generating a control signal to control the plurality of switch groups according to the judging output signal from the comparator, the timing control signal, and a voltage application part control signal to control the voltage application part, the voltage application part control signal being different from the control signal to control the plurality of switch groups and the timing control signal,
wherein the voltage application part applies the predetermined voltage to the comparison voltage after a lapse of a predetermined time after the successive comparison and terminates applying the predetermined voltage before the comparator makes a next successive comparison,
when the comparator cannot obtain the judging output signal at a time of comparison timing by the timing control signal, the judging output signal is obtained after the lapse of the predetermined time after the time of the comparison timing.

2. The successive approximation A/D converter according to claim 1, wherein a successive comparison of a holding voltage on each corresponding capacitor of the plurality of capacitors in the capacitor array with a predetermined reference voltage is made to obtain a digital output signal corresponding to an input analog signal.

3. The successive approximation A/D converter according to claim 1, wherein the capacitor array has the plurality of capacitors whose one end side is connected to a common conductor.

4. The successive approximation A/D converter according to claim 1, wherein each of the plurality of switch groups is connected to the other end of each corresponding capacitor of the plurality of capacitors in the capacitor array, and a capacitor to be applied to the successive comparison is selectively switched sequentially according to a switch group control signal of the control signal.

5. The successive approximation A/D converter according to claim 1, wherein the first controller generates the switch group control signal according to the judging output signal from the comparator.

6. The successive approximation A/D converter according to claim 1, further comprising an output register for determining a most significant bit of the digital output signal according to the judging output signal at the comparator.

7. The successive approximation A/D converter according to claim 1, further comprising a counter for arbitrarily setting the predetermined time.

8. The successive approximation A/D converter according to claim 1, wherein an asynchronous operation is performed.

9. The successive approximation A/D converter according to claim 1, wherein the voltage application part comprises a capacitor whose one end side is connected to the common conductor and a switch group connected to the other end of the capacitor.

10. The successive approximation A/D converter according to claim 1, further comprising a second controller for converting and outputting, to the first controller, the judging output signal from the comparator.

11. The successive approximation A/D converter according to claim 1, wherein
the plurality of capacitors includes a first capacitor having a capacitance C, a second to a (n−1)th capacitors having capacitances $C/2$ to $C/2^{(n-2)}$, respectively, an n-th capacitors having capacitance a $C/2^{(n-2)}-Cx$, and an (n+1)th capacitor having a capacitance Cx, where n is an integer more than 2, and Cx is larger than 0 and less than $C/2^{(n-2)}$, and
the voltage application part applies the predetermined voltage based on electric charge held in the (n+1)th capacitor to the comparison voltage.

* * * * *